US 6,543,018 B1

(12) United States Patent
Adusumilli et al.

(10) Patent No.: US 6,543,018 B1
(45) Date of Patent: Apr. 1, 2003

(54) SYSTEM AND METHOD TO FACILITATE FLEXIBLE CONTROL OF BUS DRIVERS DURING SCAN TEST OPERATIONS

(75) Inventors: Swaroop Adusumilli, Aliso Viejo, CA (US); Manoj Chandran, Tempe, AZ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/454,244

(22) Filed: Dec. 2, 1999

(51) Int. Cl.$^7$ .................................................. G01R 31/28
(52) U.S. Cl. ........................ 714/729; 714/733; 714/734
(58) Field of Search ................................. 714/724, 726, 714/727, 729, 733, 734

(56) References Cited

U.S. PATENT DOCUMENTS

| 5,528,610 A | * | 6/1996 | Edler et al. | 324/158.1 |
| 5,631,911 A | * | 5/1997 | Whetsel. Jr | 324/73.1 |
| 5,812,561 A | * | 9/1998 | Giles et al. | 714/726 |
| 5,928,374 A | * | 7/1999 | Shimizu et al. | 714/724 |
| 6,418,545 B1 | * | 7/2002 | Adusumilli | 714/729 |

FOREIGN PATENT DOCUMENTS

EP          780767 A2    6/1997   ......... G06F/11/267

* cited by examiner

*Primary Examiner*—Albert Decady
*Assistant Examiner*—Matthew Dooley
(74) *Attorney, Agent, or Firm*—Peter Zawilski

(57) ABSTRACT

The present invention is a system and method that facilitates flexible restriction of output transmissions from chosen scan test cells and reduces adverse impacts on functional components from coincidental test vector values during scan test operations. The system and method of the present invention provides the capability of masking test vector values that coincidentally trigger certain undesirable events in functional components. In one embodiment, a system and method of the present invention masks test vector values shifted into scan test cells that are coupled to bus driver enabling signals. The system and method of the of the present invention also facilitates flexible selection of which scan test cell outputs are masked and permits a scan test cell to provide a scan test vector value to an associated functional component and prevent coincidental transmission of inappropriate test vector values.

8 Claims, 8 Drawing Sheets

TRUTH TABLE

| SCAN MODE | SCAN ENABLE | OUTPUTS |
|---|---|---|
| 0 | X | Scan Test Cell functional signal |
| 1 | 1 | Scan Test Cell signal is Tri-state |
| 1 | 0 | Scan Test Cell forwards selected (decoded) signal |

FIG. 3A

SYSTEM AND METHOD TO FACILITATE FLEXIBLE CONTROL OF BUS DRIVERS DURING SCAN TEST OPERATIONS

FIELD OF THE INVENTION

The present invention relates to the field of electrical integrated circuit testing. More particularly, the present invention relates to a system and method to facilitate flexible scan testing of bus driver components.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems include processors that have facilitated increased productivity and reduced costs in analyzing and communicating data, ideas and trends in most areas of business, science, education and entertainment. Frequently, electronic systems designed to provide these results include a variety of components including microelectronic integrated circuits. Efficient and reliable performance testing of integrated circuit (IC) chips is critical to assure the IC operates properly.

The complexity of commonly used integrated circuits has advanced dramatically and built in self test (BIST) diagnostics capability is essential for effective circuit testing, debugging, and maintenance. Modern BIST techniques typically include the insertion of a scan test architecture in an IC to provide controllability and observability of IC components. Scan testing of complex electronic systems and circuits often requires analysis of measurement points (e.g., appropriately selected circuit nodes) by applying test vectors to stimulate certain aspects of a circuit (e.g., a functional logic component). For example, microelectronic chips typically have numerous connections between functional logic components and these connections are often appropriate circuit nodes for testing fault isolation and detection. Usually the greater the test coverage the greater the capacity of a scan test system and method to detect faults. However, not all features of an IC (e.g., connection nodes, functional logic components, etc.) are necessarily compatible with scan test mode operations.

Features on some integrated circuits react adversely to certain scan test vectors and do not offer a sufficient level of scan test operation predictability. For example, scan test cells usually include registers that are utilized for both normal operations and scan test operations and there is a potential for some scan test vectors to trigger inappropriate operations in the functional components if certain scan test vectors are shifted into the registers. In particular, functional logic associated with driving connections to a bus typically has a potential to create bus access conflicts during scan testing. For example, a bus driver that receives an output enable signal via a scan test cell will cause a bus driver to violate bus access constraints if an inappropriate signal is inadvertently forwarded during scan testing. Often there are difficulties in predicting the number of drivers of an IC that may be activated by some scan test vectors in a typical scan test system. More than one driver becoming active at the same time results in adverse bus access contention conditions and such bus contentions typically lead to a circuit failure.

FIG. 1 is a block diagram of a bus driver system 100. Bus driver system 100 comprises tri-state bus drivers 111 through 118, scan test cells 130 through 143, and bi-directional buses 105 and 107. Scan test cells 130 through 133 are coupled to tri-state bus drivers 111 through 114 respectively and scan test cells 140 through 143 are coupled to tri-state bus drivers 115 through 118 respectively. Bus 105 is coupled to scan test cells 130 through 133 and scan test cell 140. Bus 107 is coupled to scan test cells 140 through 144 and scan test cell 130. Bus 105 and 107 provide a communication path between components of bus driver system 100. Bus drivers 111 through 114 drive signals onto bus 105 and bus drivers 115 through 118 drive signals onto bus 107. Scan test cell 130 through 133, transmit output enable (OE) signals that activate bus drivers 111 through 113 respectively and scan test cells 140 through 143 transmit output enable (OE) signals that activate tri-state bus drivers 115 through 118 respectively. Scan test cells 130 through 143 are also utilized during scan test operations to transmit and capture scan test signals.

Serial test vectors shifted via scan test cells 130 through 143 during scan test operations can cause multiple bus drivers to attempt a bus access at the same time during a capture cycle of the scan test. During normal operations, scan test cells 130 through 143 function as registers that transmit output enable signals to bus drivers 111 through 118. Bus drivers 111 through 118 drive signals onto a bus in response to an appropriate signal from a bus driver scan test cell. During a scan test operation, scan test cells 130 through 143 function as scan test cells that shift scan test signals during a shift cycle and capture information during a capture cycle. A bus access contention problem arises during a capture cycle if the appropriate activation information is coincidentally shifted into multiple scan test cells that provide output enable signals to different bus drivers and the activation information is residing in a register of those scan test cells during a scan test capture cycle. For example, scan test cell 131 and scan test cell 133 normally transmit a logical 1 value to activate bus driver 112. During a scan test, if a test vector shifted into scan test cell 131 and scan test cell 133 includes a logical 1 value and the logical 1 value is present in scan test cells 131 and 133 during a capture cycle, then both tri-state bus drivers 112 and 114 will attempt to drive information on bus 105 at the same time causing a bus access conflict.

Some systems attempt to limit potential bus conflicts during scan testing by eliminating some scan test coverage. In some bus driver systems tri-state bus drivers are hardcoded or hardwired to limit activation of only one specific bus driver during the entire scan testing and that particular bus driver does not change. For example, bus driver 111 may be hardcoded to access bus 105 during a scan test operation and the remaining bus drivers coupled to bus 105 (e.g., bus drivers 112 though 114) are hardcoded to prevent them from accessing bus 105 during scan testing. Thus, the ability of the remaining bus drivers coupled to bus 105 (e.g., bus drivers 112 though 114) to drive a signal onto bus 105 can not be tested during scan testing. In another example some bus driver systems "tri-state" all the tri-state bus drivers during scan testing or otherwise limit the use of a tri-state bus in situations involving scan testing. In these situations, scan test coverage is lost as a result of either hardcoding to limit bus driver activation to one particular bus driver or tri-stating all the bus drivers during scan testing. In particular the ability to adequately scan test the bus driver components (e.g., bus drivers 111 through 118) is limited because all the bus drivers are not able to fully participate in the scan testing. Without the ability to appropriately control inputs to bus drivers and observe outputs, the bus drivers can not be adequately tested to determine if they are functioning correctly.

FIG. 1A is a mask diagram of a bus driver system 10A. Bus driver system 100A is similar to bus driver system 100 except scan test cell 140A and scan test cell 130A are coupled directly to bus 105 and bus 107 respectively. Thus, information is not latched between bus 105 and bus 107 when it is communicated over the bridges between bus 105 and 107. If bus driver 115A and 111A are both enabled at the same time, information can inappropriately loop around the bridges between bus 105 and bus 107. Thus, if logical values of a scan test vector is shifted into scan test cell 140A and scan test cell 130A that coincidentally match logical values of an asserted scan test driver enable signal, then an inappropriate looping of information around the bridges between bus 105 and 107 occurs. This inappropriate looping may lead to unknown or indeterminate values which result in reduced fault coverage.

What is required is a system and method that facilitates flexible scan testing of bus drivers. The system and method should permit a designer to efficiently and effectively scan test the system without permanently losing scan test coverage of a bus driver. The system and method should permit a selection of different bus drivers to participate in scan test operations while diminishing the probability of a test vector will cause a bus access conflict during a capture cycle. The system and method of the present should also facilitate the avoidance of information inappropriately looping through bridges between busses.

SUMMARY OF THE INVENTION

The present invention reduces adverse impacts on functional components during scan test operations due to coincidential effects associated test vector values by facilitating flexible restriction of output transmissions from chosen scan test cells. The system and method of the present invention permits selected masking of different scan test cell outputs, resulting in greater control of scan test operations and improved observability without permanently losing scan test coverage of a scan test cell. The system and method of the present invention permits efficient and effective scan testing of a system while diminishing the probability of a test vector creating adverse conditions for functional components.

In one embodiment of the present invention, a scan test cell restriction system facilitates appropriate scan testing of a bus driver system by permitting flexible masking of bus driver enable signals during scan test operations. A scan test cell masking component selectively masks an output transmission of a scan test cell from reaching a functional component of the bus system. The scan test cell masking component masks logical values shifted into the scan test cell during a shift cycle from being communicated during a capture cycle of a scan test operation to a functional component coupled to the output of the scan test cell. The present invention reduces the risk of coincidental adverse affects associated with a test vector shifted into a scan test cell that feeds enabling signals into a bus driver. The scan test cell masking component is activated by a scan test cell output selection component and by varying selected scan test cell masking components variety of bus drivers participate in testing operations one at a time.

BRIEF DESCRIPTION OF THE DRAWINGS

FIG. 3A is truth table for one embodiment of a flexible scan test system.

DETAILED DESCRIPTION OF THE INVENTION

Reference will now be made in detail to the preferred embodiments of the invention, a method and system to facilitate flexible scan testing of bus drivers, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The system and method of the present invention facilitates scan testing operations by permitting flexible masking of signals from selected scan test cells to functional components. The potential of adverse affects on functional components during a capture cycle of a test operation is reduced. The system and method of the present invention provides the capability of masking test vector values that coincidentally trigger certain undesirable events in functional components. In particular, the system and method of the present invention is particularly beneficial in systems that include bus drivers. By utilizing the masking capabilities associated with the present invention, test vector values shifted into scan test cells are prevented from inadvertently enabling more than one bus driver. In addition, the present invention permits outputs of different scan test cells to be selectively masked. Thus, the system and method of the present invention permits a designer to efficiently and effectively scan test the system without permanently losing scan test coverage of a bus driver.

Figure 1:
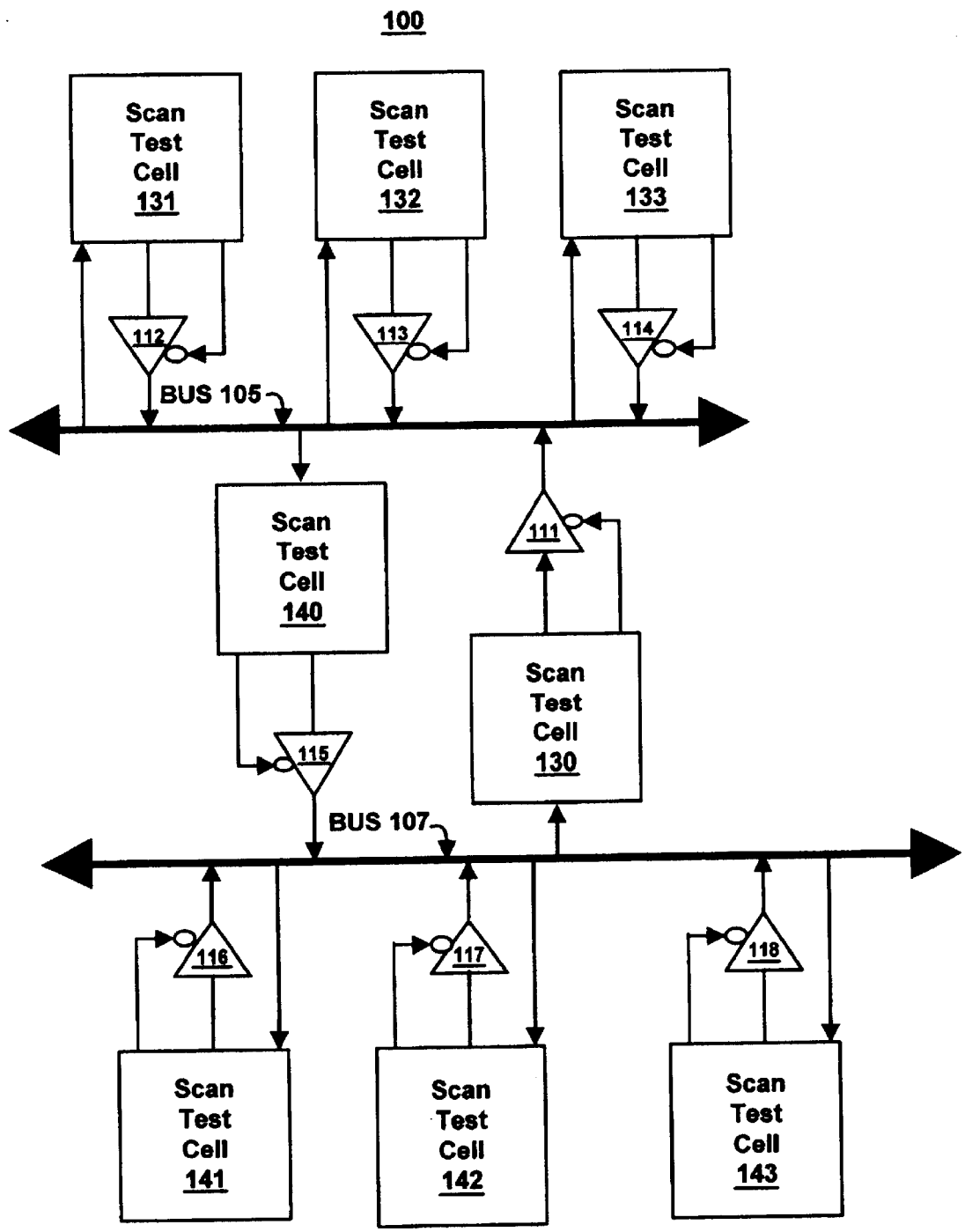
FIG. 1 is a block diagram of a prior art bus driver system in which information is latched between buses.
Figure 1A:
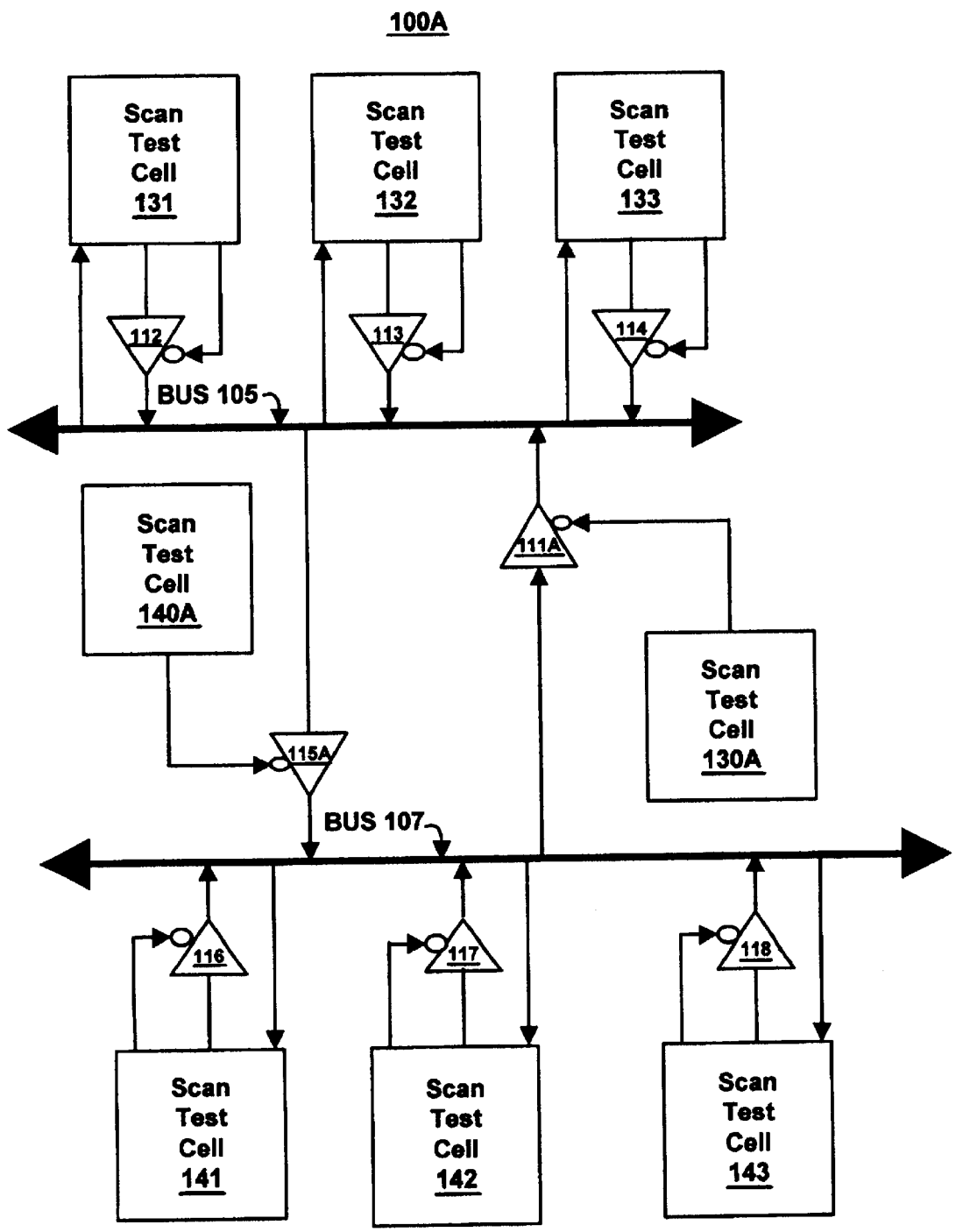
FIG. 1A is a block diagram of a prior bus driver system in which information is not latched between buses.
Figure 2:
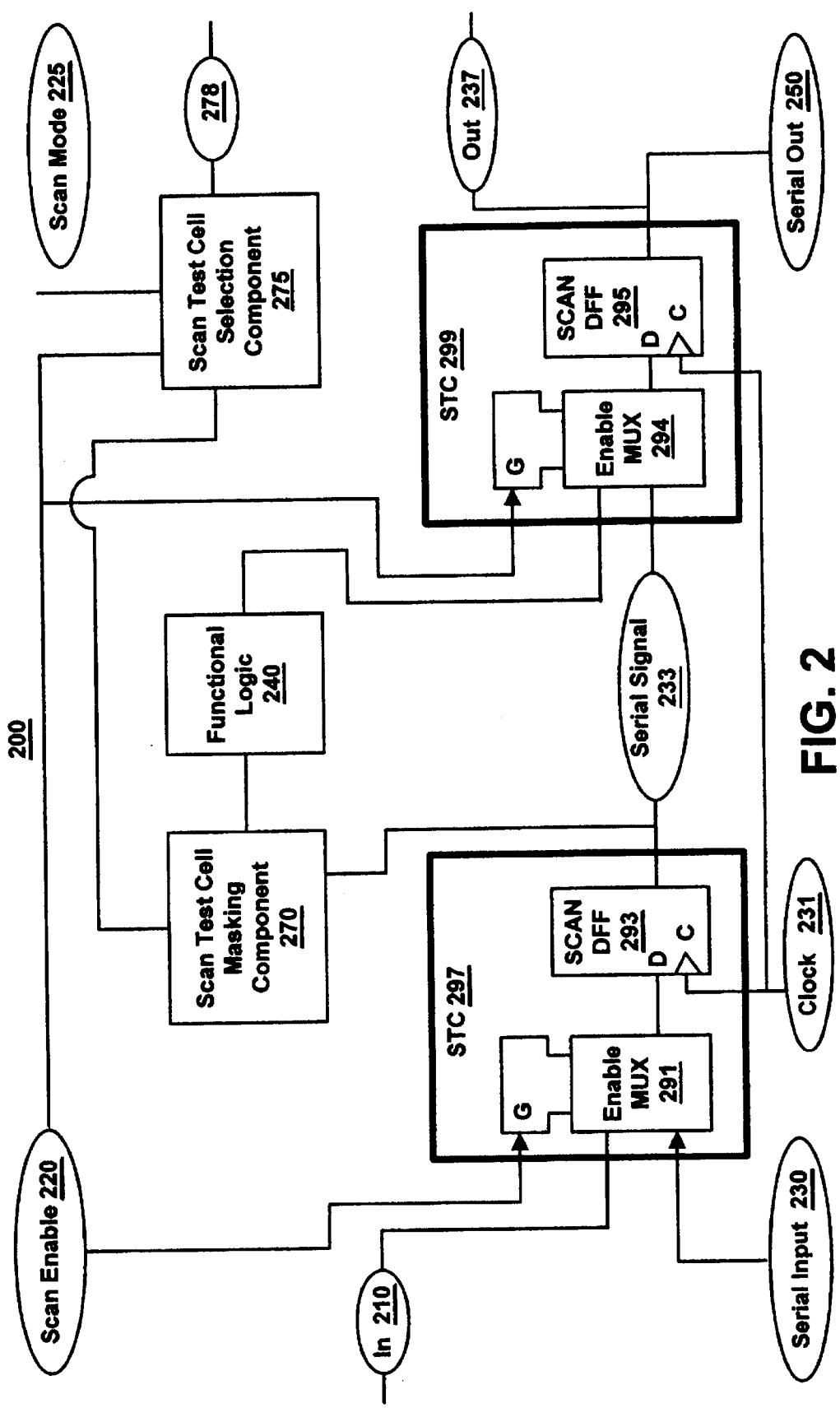
FIG. 2 is a block diagram of a flexible selection scan test chain included in one embodiment of the present invention.

FIG. 2 is a block diagram of flexible selection scan test chain 200, one embodiment of a scan chain included in the present invention. Flexible selection scan test chain 200 comprises scan test cell (STC) 297, scan test cell 299, functional logic component 240, scan test cell masking component 270 and scan test cell selection component 275. The output of scan test cell 297 is coupled to scan test cell masking component 270 and scan test cell 299. Scan test cell masking component 270 is coupled to functional logic component 240 which is coupled to the input of scan test cell 299. Scan test cell 297 comprises enable MUX 291 and scan D flip flop (FF) 293. Enable MUX 291 is coupled to normal data in signal 210, scan serial input signal 230, scan enable signal 220, and scan DFF 293. Scan DFF 293 is also coupled to clock signal 231, scan serial signal 233 and scan test cell 299. Scan test cell 299 comprises enable MUX 294 and scan D flip flop (DFF) 295. Enable MUX 294 is coupled to functional logic component 240, scan serial signal 233, scan enable signal 220, and scan DFF 295. Scan DFF 295 is also coupled to clock signal 231, normal data out signal 237 and scan serial output signal 250.

Flexible selection scan test chain 200 participates in testing of functional logic component 240 during scan test operations. Scan test cell 297 and 299 are adapted to store of latch functional values during normal operations. During scan test operations scan test cell 297 and 299 are adapted to shift test vectors and capture functional information. In one embodiment of the present invention, scan test operations begin when scan mode signal 225 is asserted. Enable MUX 291 selects normal data in signal 210 or serial data input signal 230 for transmission to scan DFF 293 depending upon the logical state of scan enable signal 220. Enable MUX 291 permits information in serial input signal 230 to be shifted into DFF 293 when scan enable signal 220 is active. Scan DFF 293 latches the signal from enable MUX 291 in response to transitions in clock signal 231. Scan DFF 293 transmits the logical value of the latched signal to scan test cell masking component 270 and enable MUX 294 as scan serial signal 233. If scan enable signal 220 is still asserted, enable MUX 294 forwards serial signal 233 to scan DFF 295 thereby "serially shifting" the information along the scan chain.

Referring to FIG. 2, scan test cell selection component 275 is adapted to select whether scan test cell masking component 270 masks signals from scan test cell 297 to functional logic component 240. Scan test cell selection component 275 similarly controls other scan test cell masking components (not shown) coupled to signal 278. In one embodiment of the present invention, scan test cell selection component 275 makes the selection based upon input from scan enable signal 220, scan test mode signal 225 and programming input. Scan test cell masking component 270 is adapted to forward or masks transmissions from scan test cell 297 to functional logic component 240 depending upon a masking instruction signal from scan test cell selection component 275. If scan test cell masking component 270 is not instructed by scan test cell selection component 275 to mask a signal, the signal is permitted to proceed to functional logic component 240. To capture the output of functional logic component 240 after it has acted upon the desired test data, scan enable signal 220 is deasserted. By deasserting scan enable signal 220, MUX 294 forwards the output of functional logic component 240 to scan DFF 295 instead serial signal 233. After the output of functional logic component 240 is transferred to Scan DFF 295 it is output either as normal output 237 signal through a normal operation output pin (not shown) or as serial output signal 250 via other scan test cells not shown) or directly to a TDO output pin (not shown).

Flexible selection scan test chain 200 facilitates reduction of adverse impacts on functional logic component 240 during scan test operations. By masking certain signals from scan test cell 297, scan test cell masking component 270 prevents an incompatible signal that is coincidentally being shifted through scan test cell 297 from being transmitted to functional logic component 240. For example, in some instances during scan test operations it is appropriate to mask a transmission of test vector data from scan test cell 297 to functional logic component 240 (e.g., if the data causes functional logic component 240 to perform an inappropriate function). In other situations during scan test operations it is appropriate to forward a transmission of data (e.g., a test vector) to functional logic component 240 to permit scan testing of functional logic component 240. For example, in one embodiment of the present invention flexible selection scan test chain 200 is implemented in a bus driver system in which functional logic components (e.g., functional logic component 240) are bus drivers and scan test cell masking components (e.g., scan test cell masking component 270) prevent inappropriate transmission of test vector data by permitting flexible selection of bus drivers that participate in scan test operations. Thus, flexible selection scan test chain 200 test vector signals that coincidentally are the same as a signal that enables a bus driver are prevented from inappropriately enabling a bus driver in one instance and permits scan test vectors signals that enable a bus driver to be communicated to the bus driver at an appropriate time (e.g., when testing the bus driver).

Figure 3:
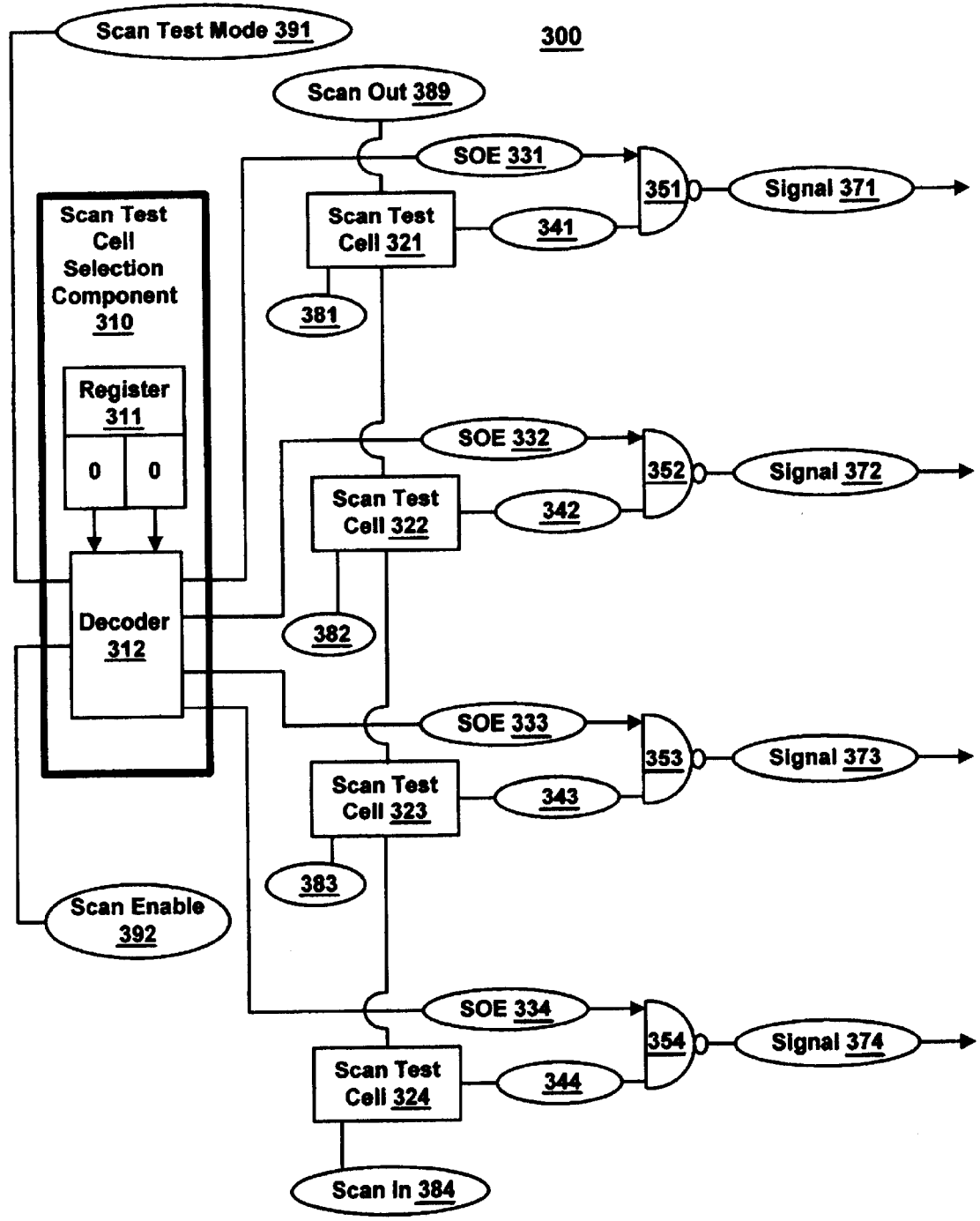
FIG. 3 is a block diagram of a flexible scan test system, one embodiment of the present invention.

FIG. 3 is a block diagram of flexible scan test system 300, one embodiment of the present invention. Flexible scan test system 300 comprises scan test cell selection component 310, scan test cells 321 through 324, and scan test cell masking components 351 through 354. Scan test cell selection component 310 comprises scan test cell selection register component 311 and scan test cell selection decoder component 312. Scan test cell selection component register component 311 is coupled to scan test cell selection decoder component 312 which is coupled to scan test modes signal 391 and scan enable signal 392. Scan test cell masking components 351 through 354 are coupled to scan test cell selection decoder component 312, scan test cells 321 through 324 respectively and functional logic components (not shown). In one embodiment of flexible scan test system 300 scan test cell masking components 351 through 354 are NAND components and scan test cell selection decoder component 312 is a two to four decoder.

The components of flexible scan test system 300 cooperatively function to facilitate scan testing operations, including testing functional components while providing protection from inappropriately activating multiple functional logic components during scan testing. Scan test cell selection register component 311 is adapted to store an identification. In one embodiment of the present invention the identification is associated with and identifies a scan test cell (e.g., scan test cells 321 through 324). In other embodiments of the present invention scan test cell selection registers store identifications of scan test cell masking components 351 through 354 or functional components (not shown) coupled to signals 371 through 374. Scan test cell selection decoder component 312 is adapted to decode information forwarded from scan test cell selection register component 311 and issue a masking assertion signal. In one example of the present invention, a scan test cell selection decoder component is adapted to issue a masking assertion signal that directs a scan test cell masking component associated with the identified scan test cell to forward the contents of the identified scan test cell and mask signals from other scan test cells. In another example of the present invention, a scan test cell selection decoder component is adapted to issue a signal directing a scan test cell masking component associated with the identified scan test cell to mask a signal from an identified scan test cell and forward signals from another scan test cell.

When a scan test mode signal 391 and scan enable signal 392 are activated, indicating scan operations are taking place, scan test cell selection decoder component 312 decodes information forwarded from scan test cell selection register component 311. Information forwarded from scan test cell selection register component 311 to scan test cell selection decoder component 312 identifies one of the scan test cells 321 through 324. Scan test cell selection decoder component 312 issues a logical 0 signal to a scan test cell masking component associated with the identified scan test cell and a logical 1 signal to other scan test cells. For example, in one embodiment of flexible scan test system 300 the scan test cells 321 through 324 are identified in scan test cell selection register component 311 by logical values 00 through 11 respectively. Thus, if scan test cell selection register 311 is storing logical value 10 when scan test mode signal is a logical 1 and scan enable signal is a logical 0, then scan test cell decoder component 312 permits scan test cell masking component 353 to forward signal 343 from scan test cell 323. Signal 343 is the same as normal functional input signal 383 or a scanned-in signal, depending upon the status of scan test cell 323. Scan test cell decoder component 312 directs scan test cell masking components 351, 352 and 354 to mask signals 341, 342 and 344 respectively.

FIG. 3A is truth table for one embodiment of flexible scan test system 300. If scan test mode signal 391 is a logical 0 then scan test cell masking components 351 through 354 forward signals 341 through 344 respectively, regardless of the logical value of scan test enable signal 392. If scan test mode signal 391 is a logical 1 and scan test enable signal 392 is a logical 1 then signals 341 through 344 are forced into a tri-state condition. If scan test mode signal 391 is a logical 1 and scan test enable signal 392 is a logical 0 the selected scan test cell masking components 351 through 354 forward the selected signal from signals 341 through 344 respectively and masks the remaining as described above.

Figure 4:
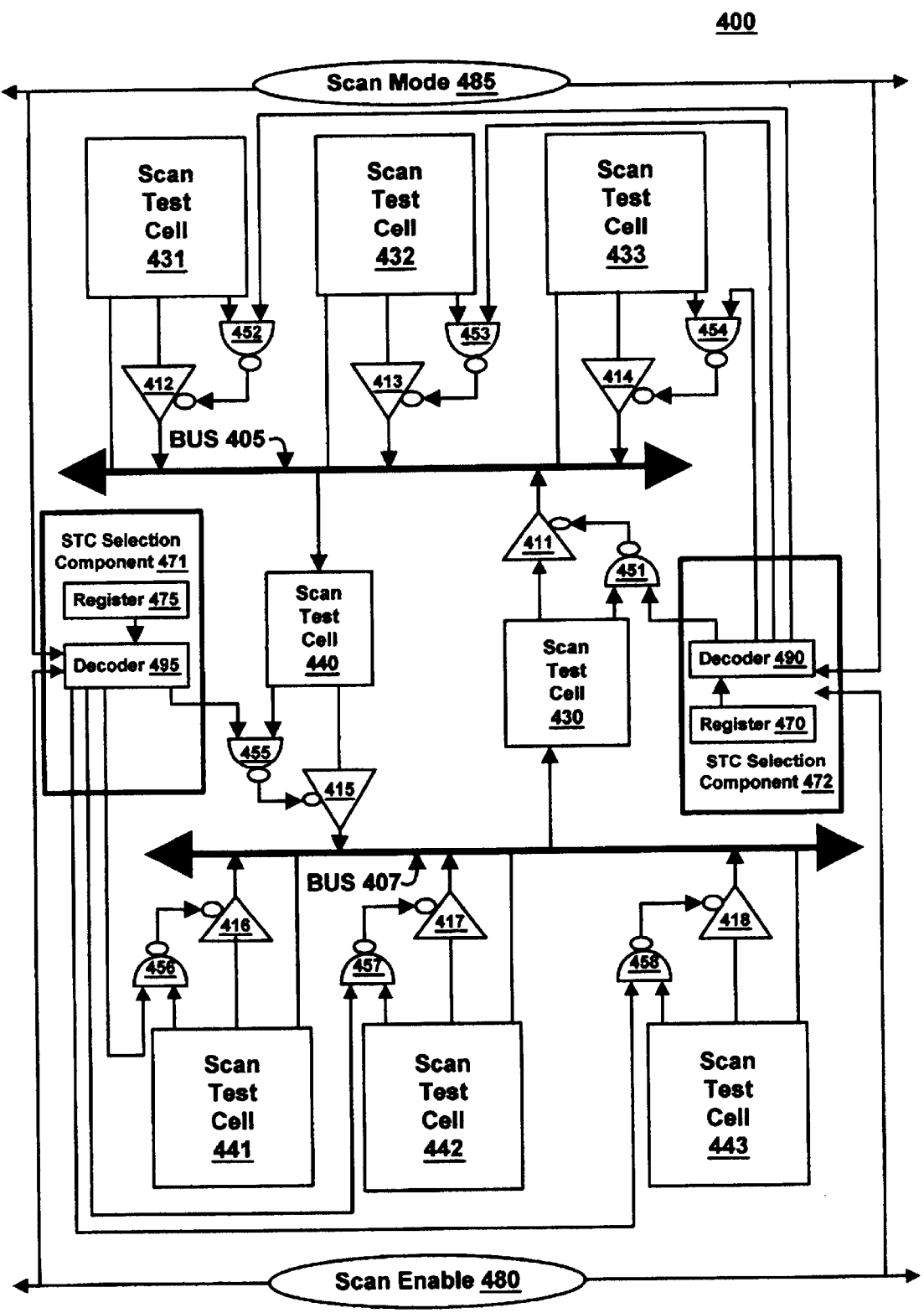
FIG. 4 is a block diagram of a scan testable bus driver system, one embodiment of the present invention.

FIG. 4 is a block diagram of a scan testable bus driver system 400, one embodiment of the present invention. Bus driver system 400 comprises tri-state bus drivers 411 through 418, scan test cells 430 through 443, bi-directional buses 405 and 407, scan test cell masking components 452 through 458, scan test cell selection component 471 and scan test cell selection component 472. Scan test cells 430 through 433 are coupled to bus drivers 411 through 414 respectively and scan test cell masking components 451 through 454 respectively. Scan test cells 440 through 443 are coupled to bus drivers 415 through 418 respectively and scan test cell masking components 455 through 458 respectively. Bus 405 is coupled to scan test cells 430 through 433 and scan test cell 440. Bus 407 is coupled to scan test cells 441 through 444 and scan test cell 430. Scan test cell selection component 471 is coupled to scan test mode signal 485, scan test enable signal 480 and scan test cell masking components 455 through 458. Scan test cell selection component 472 is coupled to scan test mode signal 485, scan test enable signal 480 and scan test cell masking components 451 through 454. In one embodiment of scan testable bus driver system 400, scan test cells 430 through 443 are also coupled to scan test mode signal 485 and scan test enable signal 480.

In one embodiment of scan testable bus driver system 400 scan test selection component 471 comprises scan test cell selection decoder component 490, scan test cell selection decoder component 495, and scan test cell selection component 472 comprises scan test cell selection register component 490 and scan test cell selection register component 495. Scan test cell selection register component 470 is coupled to scan test cell selection decoder component 490 and scan test cell selection register component 475 is coupled to scan test cell selection decoder component 495. Scan test cell selection decoder component 490 is coupled to scan test cell masking components 451 through 454 which are coupled to bus drivers 411 through 414 respectively. Scan test cell selection decoder component 495 is coupled to scan test cell masking components 455 through 458 which are coupled to bus drivers 415 through 418 respectively.

The components of scan testable bus driver system 400 shown in FIG. 4 cooperatively function to facilitate scan testing operations including the testing of different bus drivers. Bus 405 and 407 provide a communication path between components of bus driver system 400. Tri-state bus drivers 411 through 414 drive signals onto bus 405 and tri-state bus drivers 415 through 418 drive signals onto bus 407. Scan test cell 430 through 433, transmit output enable (OE) signals that activate tri-state bus drivers 411 through 414 respectively and scan test cells 440 through 443 transmit output enable (OE) signals that activate tri-state bus drivers 415 through 418 respectively. Scan test cells 430 through 443 are also utilized during scan test operations to transmit and capture scan test signals. Scan test cell masking components 451 through 454 mask signals from scan test cells 430 through 433 based upon instructions from scan test cell selection component 472. Similarly, scan test cell masking components 455 through 458 mask signals from scan test cells 440 through 443 based upon instructions from scan test cell selection component 471.

Scan test cell selection component 472 and 471 are adapted to provide masking notification signals to scan test cells. Scan test cell selection decoder component 490 and 495 decode information forwarded from scan test cell selection register components 470 and 475 respectively. Scan test cell selection decoder component 490 and 495 are also adapted to issue masking trigger signals to scan test cell masking components 451 through 454 and scan test cell masking components 455 through 458 respectively. Scan test cell selection register components 470 and 475 store information identifying a selected scan test cell masking component coupled to bus 405 and bus 407 respectively. In one embodiment of the present invention information identifying a selected scan test cell masking component is dynamically programmed into a scan test cell selection register component (e.g., scan test cell selection register component 470).

Referring to FIG. 4, scan testable bus driver system 400 prevents serial test vectors transmitted via scan test cells 430 through 443 from enabling multiple bus drivers to attempt a bus access at the same time during a capture cycle of a scan test. In one embodiment of the present invention, scan test cell 431 through 443 normally transmits a logical 0 value to activate or enable bus drivers 411 through 418 respectively. If a capture cycle is initiated when coincidentally a logical 0 value of the test vector is located in more than one of the scan test cells 431 through 433 scan testable bus driver system 400 permits the tri-state bus drivers 411 through 414 to attempt to drive information on bus 405 one at a time, thus avoiding a bus access conflict. One embodiment of scan testable driver system 400 automatically recognizes that a scan test vector includes logical values that enable bus drivers and takes measures to prevent the logical values from triggering an inadvertent buss access attempt during a capture cycle of a scan operation. For example, when decoder 490 and decoder 495 direct a scan test cell masking component 451 through 458 to mask a signal from scan test cell components 430 through 443 respectively, scan test cell masking components 451 through 458 forward a predetermined logical value (e.g., a logical 1) to bus drivers 411 through 418 that does not activate the bus drivers.

In one implementation of a scan test shift operation utilizing the present invention, an automatic test pattern generation (ATPG) tool generates a test vector 1010 and the test vector is transmitted ("shifted") through scan test cell 431 and 433. In one embodiment of the present invention, scan test cell masking components 452 and 454 are directed by scan test cell selection decoder component 490 to mask signals from scan test cells 431 and 433 respectively. In one example of scan testable bus driver system 400, scan test cell masking components 452 and 454 are directed by scan test cell selection decoder component 490 to mask signals from one of the scan test cells (e.g., scan test cells 433) and mask signals from the other scan test cells (e.g., scan test cells 430 through 432). In one example of scan testable bus driver system 400, scan test cell selection register component 470 is programmed to notify scan test cell selection decoder component 495 to direct scan test cell masking component 454 to permit transmission of the logical 0 value in scan test cell 433 to bus driver 414. Scan test cell selection register component 470 is programmed to notify scan test cell selection decoder component 495 to direct scan test cell masking component 451 through 453 to mask transmission of respective logical values in scan test cell 431 through 343 to bus drivers 411 through 413. Scan test cell masking component 451 through 453 forward a logical 1 value to bus driver 412. Thus, bus driver 414 is able to access bus 405 and bus driver 412 is not, thereby avoiding bus contention conflicts.

Figure 4A:
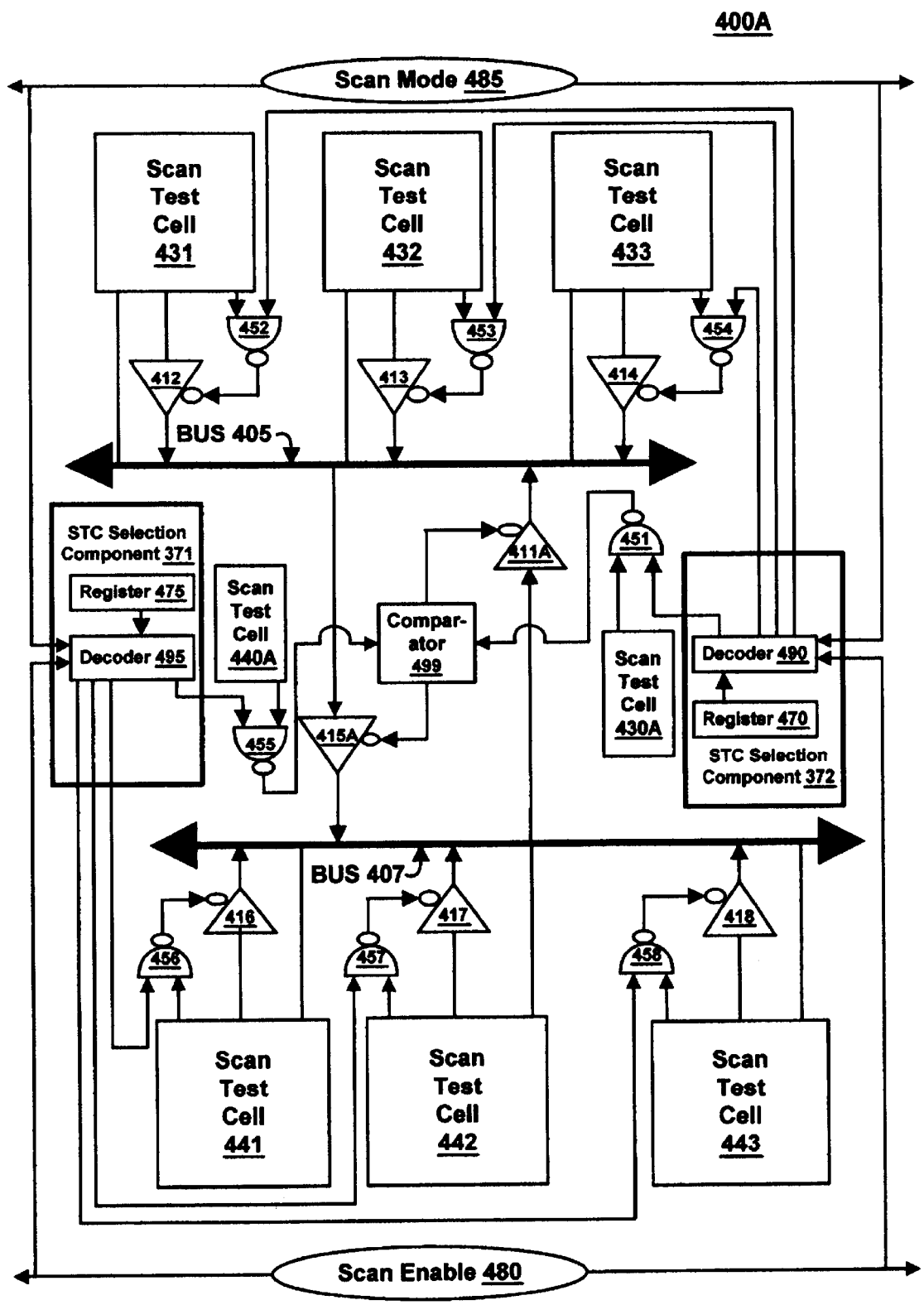
FIG. 4A is a block diagram of scan testable bus driver system, one embodiment of the present invention in which the scan testable bus driver system does not have transceivers communicating information between buses.

FIG. 4A is a block diagram of scan testable bus driver system 400A, one embodiment of the present invention. Scan testable bus driver system 400A is similar to scan testable bus driver system 400 except scan testable bus driver system 400A does not have transceivers communicating information between bus A and bus B. In the embodiment of scan testable bus driver system 400 illustrated in FIG. 4, data communicated from bus A to bus B is latched. In scan testable bus driver system 400A shown in FIG. 4A data communicated from bus A to bus B is not latched. Scan testable bus driver system 400A comprises the same components as scan testable bus driver system 400 in addition to comparator 499. Scan test cell 440A and Scan test cell 430A are not directly coupled to bus 405 and bus 407 respectively, rather bus driver 415A and 411A are directly coupled to both bus 405 and 407. Thus, normal communications between the buses is not latched in scan test cell 440A and scan test cell 430A. Scan test cell masking component 451 and 455 are coupled to comparator 499 which is coupled to bus driver 415A and 411A.

The components of scan testable bus driver system 400A cooperatively function to facilitate scan testing operations, including the testing of different bus drivers and facilitates the avoidance of endless information looping through bridges between bus 405 and 407. Scan testable bus driver system 400A facilitates scan testing of a bus driver system by permitting flexible selection of bus drivers that participate in scan test operations. In a manner similar to scan testable bus driver system 400 described above, scan testable bus driver system 400 selectively masks component an output transmission of a scan test cell from reaching a bus driver thereby preventing inadvertent enablement of multiple bus drivers. Comparator 499 prevents inadvertent looping of information between bus 405 and 407 by overriding bus driver enable signals to bus driver 415A and bus driver 411A.

Comparator 499 analyzes the bus driver enable signals to both bus drivers 415A and 411A and determines if the both bus driver enable signals are asserted. If one bus driver enable signal is asserted comparator 499 forwards that signal to the respective bus driver (e.g., bus driver 415A or 411A). If both bus driver signals are asserted comparator forwards an assertion signal to one of the bus drivers (e.g., bus driver 411A) forwards a deaserting signal to the other bus driver (e.g., bus driver 415A). In one example, a scan test vector is shifted into scan test cells 440A and 430A that coincidentally includes logical values indicating a direction to enable bus drivers 415A and 411A respectively and scan test cell masking components 455 and 451 forward the logical value, comparator 499 selectively forwards an asserted bus driver enable signal to bus driver 415A or 411A and a deasserted bus driver enable signal to the other. Thus comparator 499 facilitates the avoidance of inappropriate information looping between bus 405 and bus 407 by enabling one of the bridges between the buses and disabling the other thereby permitting information to flow in one direction and not the other.

Figure 5:
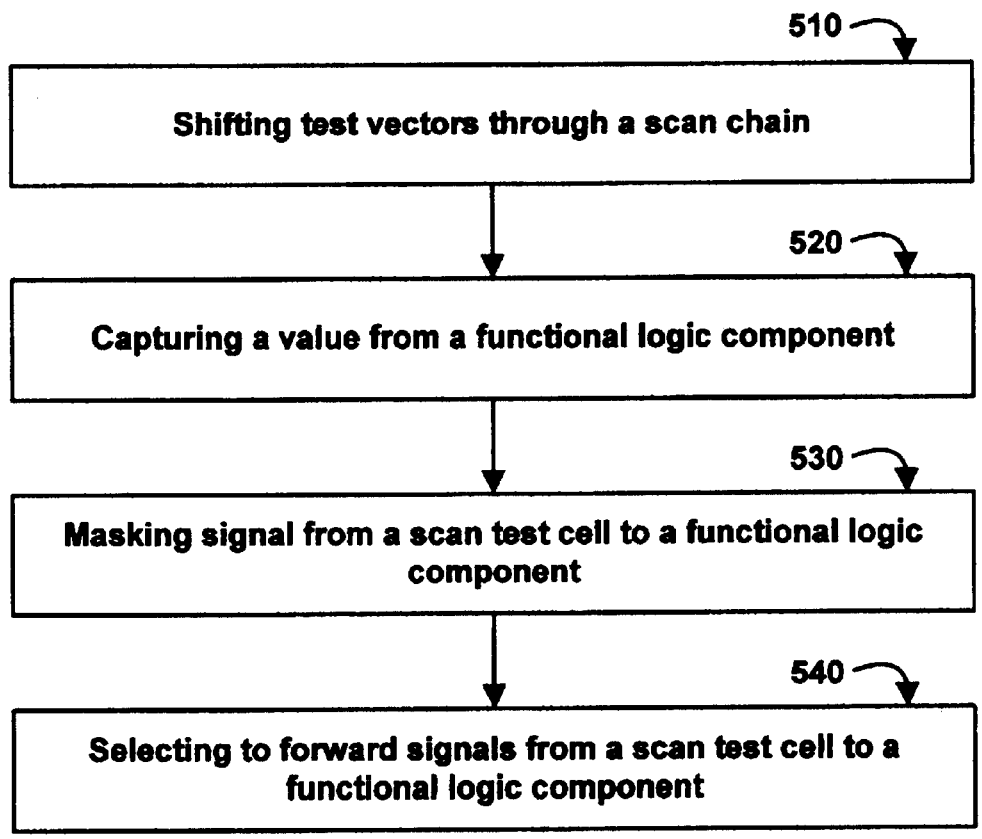
FIG. 5 is a flow chart of the steps included in one embodiment of a flexible scan test method of the present invention.

FIG. 5 is a flow chart of the steps included in flexible scan test method 500. Flexible scan test method 500 facilitates efficient and effective scan testing operations by permitting flexible masking of signals from selected scan test cells to functional components. The present invention reduces the potential of test vector values that coincidentally trigger certain undesirable events in functional components during a capture cycle of a test operation is reduced. In one embodiment of the present invention, flexible scan. test method 500 is implemented in a system that include bus drivers. By utilizing flexible scan test method 500 test vector values shifted into scan test cells are prevented from inadvertently enabling more than one bus driver while maintaining the ability to individually test bus drivers.

In Step 510 test vectors are shifted through a scan chain comprising a scan test cell. In one embodiment of flexible scan test method 500 test vectors are shifted through a scan test chain by asserting a scan test mode signal and a scan test enable signal and applying a test vector. In one example the test vector is generated by an automatic test pattern generation (ATPG) tool. In one embodiment of flexible scan test method 500, the scan chain is similar to flexible selection scan test chain 200.

Flexible scan test method 500 captures a value from a functional logic component in Step 520. In one embodiment flexible scan test method 500 captures a value from a functional logical component by deasserting a scan test enable signal while maintaining a scan test mode signal. A value from the functional unit is captured in a register of a scan test cell. In one example of flexible scan test method 500 the scan test cell is similar to scan test cell 299.

In Step 530 signals from a scan test cell to a functional logic component are masked. In one embodiment of the present invention, flexible scan test method 500 selects to forward signals from a scan test cell to a functional logic component by storing a scan test masking component identification, decoding the identification, and issuing a direction to mask a signal coupled to a scan test masking component that is not identified. In another embodiment of the present invention a direction is issued to mask a signal coupled to a scan test masking component that is identified. In one example flexible scan test method 500 a scan test cell is similar to scan test cell 392 and in another example of flexible scan test method 500 a scan test cell is similar to scan test cell 432. In one embodiment of the present invention, a signal from a scan test cell to a functional logic component is masked by utilizing a logical component (e.g., a NAND gate) to impose a predetermined logical value on the signal. For example, in a system including bus drivers that receive enable signals via a scan test cell, flexible scan test method 500 masks a signal from the scan test cell with a logical value (e.g., a logical 1) that does not enable the bus driver.

In Step 540, flexible scan test method 500 selects to forward signals from a scan test cell to a functional logic component. In one embodiment of the present invention, flexible scan test method 500 selects to forward signals from a scan test cell to a functional logic component by storing an scan test masking component identification, decoding the identification, and issuing a direction to forward a signal coupled to the identified scan test masking component. In one embodiment of the present invention the selection of a scan test masking component is made by a scan test cell selection component similar to scan test cell selection component 310.

In one embodiment of the present invention flexible scan test method 500 analyzes bus driver enable signals to bus drivers coupled to a plurality of buses. Flexible scan test method 500 determines if the both bus driver enable signals are asserted. If one bus driver enable signal is asserted flexible scan test method 500 forwards that signal to the respective bus driver. If multiple bus driver signals are asserted flexible scan test method 500 forwards an assertion signal to one of the bus drivers (e.g., bus driver 411A) and forwards a deasserting signal to the other bus driver (e.g., bus driver 415A). Thus, flexible scan test method 500 facilitates the avoidance of inappropriate information looping between buses by enabling one of the bridges between the buses and disabling other bridges.

Thus, the present invention facilitates flexible scan testing of bus drivers. The system and method of the present invention permits a designer to efficiently and effectively scan test the system without permanently losing scan test coverage of a bus driver. The system and method of the present invention permits a selection of different bus drivers to participate in scan test operations while diminishing the probability of a test vector will cause a bus access conflict during a capture cycle. The system and method of the present also facilitates the avoidance of information inappropriately looping through bridges between busses.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A flexible scan testable bus driver system comprising:
   a bus adapted to provide a communication path between components of said bus driver system,
   a bus driver coupled to said bus, said bus driver adapted to drive signals onto said bus;
   a scan test cell coupled to said bus driver, said scan test cell adapted to transmit an output enable (OE) signal that activates said bus driver;
   a scan test cell masking component coupled to said scan test cell, said scan test cell masking component adapted to mask signals from said scan test cell; and
   a scan test cell selection component coupled to said scan test cell masking component, said scan test cell selection component adapted to provide masking notification signals to said scan test cell.

2. A flexible scan testable bus driver system of claim 1 in which said scan test cell masking component prevents a scan test signal that enables a bus driver from inappropriately enabling a bus driver in one instance and permits said scan test vectors signals to enable a bus driver to be communicated to said bus driver at an appropriate time.

3. A flexible scan testable bus driver system of claim 1 in which said scan test cell selection component comprises:
   a scan test cell selection register component adapted to store information identifying a said scan test cell masking component; and
   a scan test cell selection decoder component coupled to said a scan test cell selection register component; said scan test cell selection decoder component adapted to decode information forwarded from said scan test cell selection register component.

4. A flexible scan testable bus driver system of claim 3 in which identifying a selected scan test cell masking component is dynamically programmed into said scan test cell selection register component.

5. A flexible scan testable bus driver system of claim 1 further comprising;
   a second bus coupled to said bus driver, said second bus adapted to communicate information; and
   a comparator coupled to said bus driver, said comparator adapted to prevent inadvertent looping of information between said bus and said second bus.

6. A flexible scan testable bus driver system of claim 5 in which said comparator prevents inadvertent looping of information between said bus and said second bus by overriding bus driver enable signals to said bus driver.

7. A flexible scan test method comprising the steps of:
   shifting test vectors through a scan chain comprising a scan test cell;
   capturing a value from a functional logic component;
   masking signals from a scan test cell to a functional logic component; and
   selecting to forward signals from a scan test cell to a functional logic component, analyzing bus drive enable signals;
   determining if a plurality of said bus driver enable signals are asserted;
   forwarding an assertion signal to a first bus driver; and
   forwarding a de-assertion signal to a second bus driver.

8. A flexible scan test method of claim 7 further comprising the steps of:
   enabling a first bridge between a plurality of buses; and
   disabling other bridges between said plurality of buses.

* * * * *